(12) United States Patent
Maier

(10) Patent No.: US 7,369,079 B2
(45) Date of Patent: May 6, 2008

(54) UNIVERSAL INPUT/OUTPUT MODULE

(75) Inventor: Josef Maier, Munningen (DE)

(73) Assignee: Hamilton Sundstrand Corporation, Rockford, IL (US)

( * ) Notice: Subject to any disclaimer, the term of this patent is extended or adjusted under 35 U.S.C. 154(b) by 0 days.

(21) Appl. No.: 11/481,454

(22) Filed: Jul. 6, 2006

(65) Prior Publication Data

US 2008/0007441 A1    Jan. 10, 2008

(51) Int. Cl.
*H03M 1/12* (2006.01)
(52) U.S. Cl. .......................... 341/155; 341/156; 701/14
(58) Field of Classification Search ................ 341/155, 341/156; 701/1, 14
See application file for complete search history.

(56) References Cited

U.S. PATENT DOCUMENTS

| | | | | |
|---|---|---|---|---|
| 4,626,996 | A * | 12/1986 | Arlott .......................... | 701/14 |
| 5,221,928 | A * | 6/1993 | Dahl ........................... | 342/205 |
| 5,465,079 | A * | 11/1995 | Bouchard et al. ........... | 340/576 |
| 5,913,911 | A * | 6/1999 | Beck et al. .................... | 701/1 |
| 6,816,090 | B2 * | 11/2004 | Teckchandani et al. ..... | 340/989 |
| 2005/0134488 | A1 | 6/2005 | Alter | |
| 2008/0007441 | A1 | 1/2008 | Maier | |

FOREIGN PATENT DOCUMENTS

| | | |
|---|---|---|
| WO | WO 9932856 | 7/1999 |
| WO | WO 2006007105 | 1/2006 |

OTHER PUBLICATIONS

Extended European Search Report dated Feb. 26, 2008.

* cited by examiner

*Primary Examiner*—Jean B Jeanglaude
(74) *Attorney, Agent, or Firm*—Carlson, Gaskey & Olds

(57) ABSTRACT

A universal input/output module may be tailored to enable or disable a pull-up or pull-down function such that distinct type digital signals reaching the digital signal processor may be changed such that the distinct digital signals are similar in nature when processed. The digital signal processor is able to enable or disable a pull-down or a pull-up function to provide the ability to universally handle these distinct digital signal types. In other features, a plurality of the modules may be associated with a common power supply, board controller and central communication bus. The input/output modules have applications such as in processing a switch or sensor signal, and outputting a control signal to an associated component.

9 Claims, 1 Drawing Sheet

UNIVERSAL INPUT/OUTPUT MODULE

BACKGROUND OF THE INVENTION

A input/output module that will typically take in a signal from a switch or sensor, process that signal, and send a control signal to an associated component (either directly or commanded by a central μC board) is provided with structure such that it can be tailored to operate with distinct signal types from the switch or sensor. In addition, a plurality of the modules are associated with common power and control functions.

The control of various systems such as may be associated with a vehicle or other complex systems must take in various electronic signal and process those signals to control associated components. These controls are becoming more and more complex.

One type of control element is an input/output module. An input/output module receives an input signal, such as from a switch or sensor, respectively a digital or an analog signal. The signal from a sensor might be that a particular condition has been sensed, and some control step should now be taken. The input from a switch may be that the switch has switched from off to on, and some control must be taken. The "output" of the module is typically sending a signal to control an associated component based upon the signal from the switch or sensor or from a central μC board. In the past, there have been a plurality of these modules associated with more complex systems. Typically, a single digital signal processor ("DSP") has been associated with a plurality of input/output modules. This has been somewhat undesirable in that a failure of that single processor would cause all of those control systems to fail. Further, in the past, each of the various modules have been provided with individual power supplies and control functions. Also, the modules that are known have not been able to be tailored to handle several distinct types of signals.

SUMMARY OF THE INVENTION

In a disclosed embodiment of this invention, a universal input/output module is provided which can take in distinct type signals. As an example, the signal can be between one of two states such as "ground-open" or "high-open." The DSP enables or disables a pull-up and pull-down box such that those two distinct signals are processed in a manner such that the single DSP can handle them universally.

In further features of this invention, a plurality of the modules are provided with a common power supply. Also, a plurality of the modules report over common communication lines to a central controller over a control bus. In addition, a board microcircuit communicates with each of the plurality of modules. It is preferred that there are redundant power supplies, communication lines, and lines from the board microcircuit such that the failure of any one line does not stop the operability of the overall system.

These and other features of the present invention can be best understood from the following specification and drawings, the following of which is a brief description.

DETAILED DESCRIPTION OF THE PREFERRED EMBODIMENT

Figure 1:
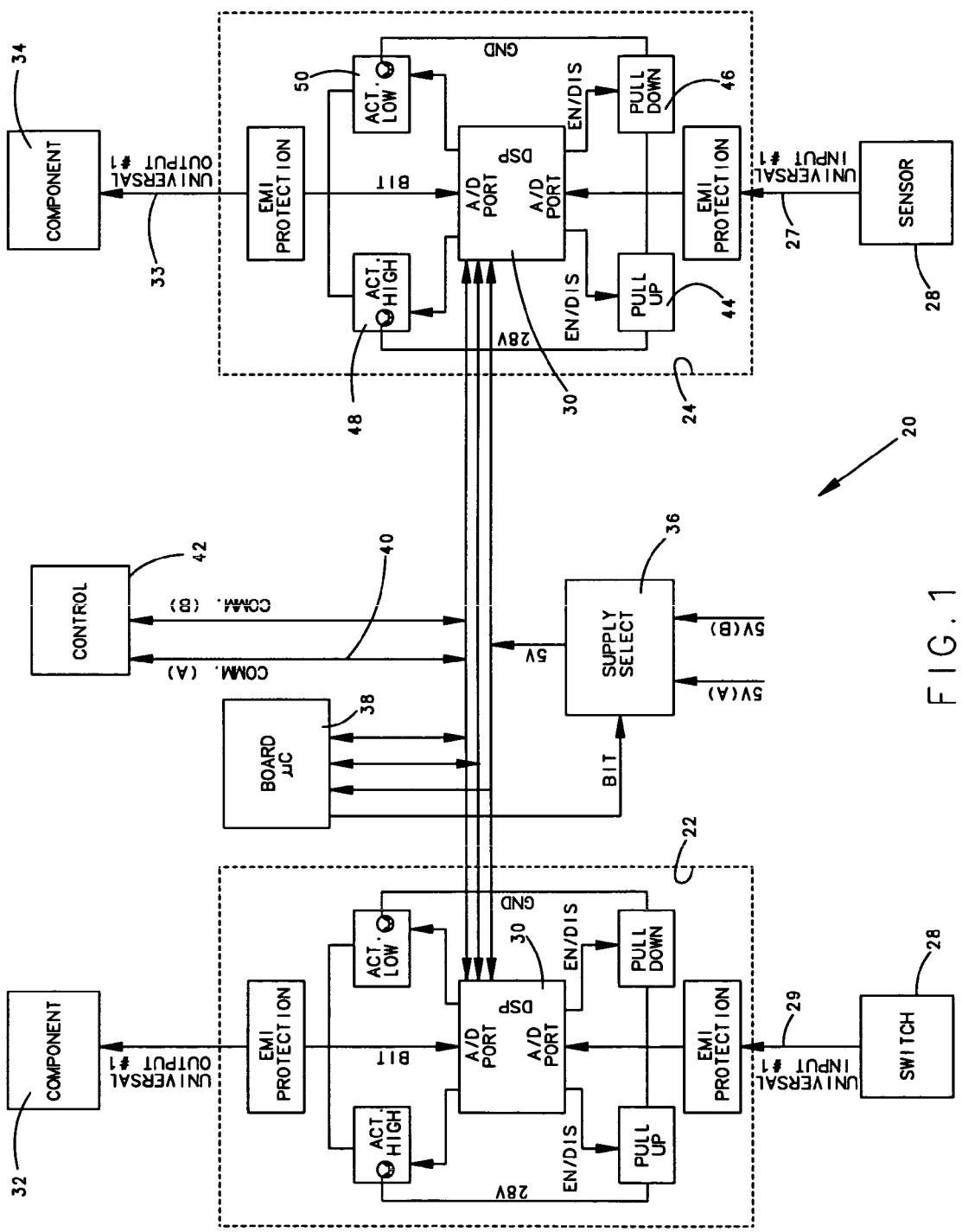
FIG. 1 is a schematic of the inventive system.

A circuit 20 is illustrated in FIG. 1, which includes two input/output modules 22 and 24. The modules may be identical, as they are universal and can provide control signal processing for distinct signals. While only two modules are shown, it should be understood that the teachings of this invention would extend to a control circuit including even more modules.

The module 22 is shown receiving an input 29 from a switch 28. Module 22 processes the signal 29, and sends an output signal 31 to control the component 32 or sends the result of its processing to the central μC board, which based on this information and other available information will finally command the signal to the output. In a disclosed embodiment, this is used on an aircraft.

In a similar manner, the module 24 is shown receiving a signal 27 from a sensor 26. Module 24 processes this input and sends an output 33 to control another component 34 or sends the result of its processing to the central μC board, which based on this information and other available information will finally command the signal to the output.

The applications of the switches, sensors and components which may benefit from the inventive universal input/output module are numerous, and known in the art. One application of these systems would be for complex control systems that are typically found on aircraft. However, the present invention extends beyond that specific application.

Each of the modules is provided with a distinct DSP. The DSPs are operable to tailor a pull-up 44 and pull-down 46 component. These components are either enabled or disabled when the module is initially installed in the system. Also, "Act. High" and "Act. Low" are also provided and can be commanded by the DSP exclusively to provide a ground open or a 28V open output. Applying both output types exclusively also allows one to create a pulse width modulated output, i.e. used to dim lights or speed regulate motors. The input signals 27 or 29 can vary depending upon the switch or sensor that has been connected to the module. As one example, the signal could be either ground or open in one typical application, and in another application the signal could be high or open. A main goal of this universal input module is to provide the functionality such that either type signal, including analog signals, can be processed by this universal input/output module. Thus, the pull-down or pull-up component is enabled dependent on the type of switch or sensor such that the signal reaching the DSP 30 is a common signal no matter the type of input. Analog signals may need no such processing, but can be sent directly to DSP 30.

Another feature of the present invention is that a common power supply 36 communicates to each of the modules 22 and 24. As shown, redundant voltage supplies are provided to the supply 36. The redundancy ensures that a single power supply failure will not result in an entire circuit failing.

In a similar manner, a board microcontroller 38 communicates over redundant lines to both modules. Bus communication lines 40 report to a central control 42, and again the communication lines 40 are common to each of the modules and redundant lines are provided.

The present invention thus provides a universal input/output module which can be self-tailored to handle various type signals.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. An input/output module comprising:
a digital signal processor for providing an analog to digital conversion, said digital signal processor receiving an input signal, said input signal being one of a plurality of distinct type signals, and said module being operable to enable or disable system components to change the input signal before it reaches the digital signal processor based upon which one of said plurality of distinct type signals is received.

2. The input/output module as set forth in claim 1, wherein said digital signal processor is provided with a pull-up and pull-down component, which may be selectively enabled such that distinct type signals on said input are changed to be similar signals before reaching said digital signal processor.

3. A control system comprising:
a plurality of input/output modules, each said plurality of input/output modules receiving a signal from one of a switch and a sensor, and processing said signals to control a system component, each of said input/output modules being provided with a digital signal processor; and
a common power supply for powering each of said plurality of input/output modules.

4. The control system as set forth in claim 3, wherein a common board microcontroller communicates with each of said plurality of input/output modules.

5. The control system as set forth in claim 4, wherein a common communication bus communicates said plurality of input/output modules with a central control.

6. The control system as set forth in claim 5, wherein each of said common power supply, said common microcircuit, and said common communication bus are provided over redundant lines.

7. The control system as set forth in claim 3, wherein said digital signal processor is provided with a pull-up and pull-down component, which may be selectively enabled such that distinct type signals on said input are changed to be similar signals before reaching said digital signal processor.

8. The control system as set forth in claim 3, wherein said system components includes lights and motors, with said module controlling the intensity of said lights, and the speed of said motors with pulse width modulation control.

9. The input/output module as set forth in claim 1, wherein said system components include at least one of lights and electric motors, with said module being operable to change the intensity of the lights or the speed of the motors based upon said signal input.

* * * * *